(12) United States Patent
Wang et al.

(10) Patent No.: US 7,078,761 B2
(45) Date of Patent: Jul. 18, 2006

(54) NONVOLATILE MEMORY SOLUTION USING SINGLE-POLY PFLASH TECHNOLOGY

(75) Inventors: Alex Wang, Cupertino, CA (US); Shang-De Ted Chang, Fremont, CA (US); Han-Chih Lin, Hsin-Chu (TW); Tzeng-Huei Shiau, Hsin-Chu (TW); I-Sheng Liu, San Jose, CA (US); Hsien-Wen Liu, Taoyuan (TW)

(73) Assignee: Chingis Technology Corporation, San Jose, CA (US)

( * ) Notice: Subject to any disclaimer, the term of this patent is extended or adjusted under 35 U.S.C. 154(b) by 119 days.

(21) Appl. No.: 10/794,564

(22) Filed: Mar. 5, 2004

(65) Prior Publication Data
US 2005/0199936 A1    Sep. 15, 2005

(51) Int. Cl.
*H01L 29/788* (2006.01)
(52) U.S. Cl. ................. 257/315; 257/318; 257/E29.255
(58) Field of Classification Search ........ 257/314–316, 257/318, 326
See application file for complete search history.

(56) References Cited

U.S. PATENT DOCUMENTS

| 5,736,764 A | * | 4/1998 | Chang ..................... 257/318 |
| 5,912,842 A | * | 6/1999 | Chang et al. .......... 365/185.11 |
| 6,166,954 A | * | 12/2000 | Chern .................. 365/185.14 |
| 6,788,573 B1 | * | 9/2004 | Choi ..................... 365/185.05 |

* cited by examiner

*Primary Examiner*—T. N. Quach
(74) *Attorney, Agent, or Firm*—Jonathan W. Hallman; MacPherson Kwok Chen & Heid LLP

(57) ABSTRACT

A single-poly two-transistor PMOS memory cell for multiple-time programming applications includes a PMOS floating gate transistor sharing a drain/source P+ diffusion region with a PMOS select gate transistor all formed within a first n-well. A control plate for the floating gate transistor is formed in a second n-well. A single-poly two-transistor PMOS memory cell for one-time programming applications includes a PMOS floating gate transistor having a source formed as a p+ diffusion region in a single n-well. The source is adapted to also serve as control plate for the floating gate transistor.

7 Claims, 4 Drawing Sheets

NONVOLATILE MEMORY SOLUTION USING SINGLE-POLY PFLASH TECHNOLOGY

FIELD OF INVENTION

This invention relates generally to memory cells, and more particularly to single-polysilicon-layer two-transistor PMOS memory cells for multiple-time programming (MTP) and one-time programming (OTP) applications.

BACKGROUND

As compared to NMOS floating gate (FG) memory cells, PMOS FG memory cells have desirable band-to-band tunneling (BTBT) programming efficiencies. But memory arrays comprised of single transistor PMOS FG memory cells may suffer from problems such as over-erase and BTBT program disturbance, thereby compromising data integrity. As disclosed in commonly-assigned U.S. Pat. No. 5,912,842, the BTBT disturb problem may be solved by constructing memory arrays with two-transistor (2T) PMOS memory cells.

The 2T PMOS memory cell approach has been adapted for integration with CMOS logic processes providing just a single polycrystalline silicon (poly) layer. For example, commonly-assigned U.S. Pat. No. 5,736,764 discloses a variety of 2T PMOS memory cells in which a diffusion region serves as the control plate. To achieve a high density design, the buried diffusion region may be located in the same n-well holding the 2T PMOS cell. It is advantageous to then isolate the buried diffusion region with a P-type layer from the N-well. This isolation requires an additional mask step as well as an additional implantation step.

There are applications, however, wherein a memory array formed using 2T PMOS memory cells need not be pushed to achieve high density. For example, a user may require a nonvolatile memory to store relatively small words such as a radio frequency identification number (RFID). Such a memory need only provide storage for one to two K-bits for typical RFID applications. For such applications, the silicon area occupied by the nonvolatile memory will only be a relatively small portion of that required for the overall integrated circuit. Thus, instead of memory cell size concerns, other concerns may drive the memory design in such applications. For example, a user may desire that no additional mask steps be required other than those already provided for in a standard CMOS logic process, However, as discussed with respect to U.S. Pat. No. 5,736,764, previous single-poly 2T PMOS memory cell designs typically require extra mask steps to form the control plate.

In other applications, a user may allow for the possibility of additional mask steps besides those already provided for in a standard single-poly CMOS logic process so to accomplish higher density designs. However, the silicon area required for the control plate in conventional single-poly 2T PMOS memory cell designs makes a high density single poly design problematic.

Accordingly, there is a need in the art for improved single-poly 2T PMOS memory cell designs compatible with conventional CMOS processes. In addition, there is a need in the art for improved high-density single-poly 2T PMOS memory cell designs.

SUMMARY

In accordance with one aspect of the invention, a single-poly two-transistor PMOS memory cell is provided for multiple-time programming applications. The memory cell includes a PMOS select gate transistor having a drain and a source formed as separate P+ diffusion regions in a first n-well; a PMOS floating gate transistor having a drain and a source formed as separate p+ diffusion regions in the n-well, wherein the p+ diffusion region that forms the floating gate transistor's drain is the same p+ diffusion region that forms the select gate transistor's source; and a control plate for the floating gate transistor formed within a second N-well.

In accordance with another aspect of the invention, a single-poly two-transistor PMOS memory cell is provided for one-time programming applications. The single-poly 2T PMOS memory cell includes a PMOS select gate transistor having a drain and a source formed as separate p+ diffusion regions in a first n-well; and a PMOS floating gate transistor having a drain and a source formed as separate pt diffusion regions in the n-well, wherein the p+ diffusion region that forms the floating gate transistor's drain is the same p+ diffusion region that forms the select gate transistor's source; and wherein the source of the floating gate transistor is adapted to serve as the control plate.

In accordance with yet another aspect of the invention, a single-poly two-transistor PMOS memory cell is provided for onetime programming applications. The single-poly 2T PMOS memory cell includes a PMOS select gate transistor having a drain and a source formed as separate p+ diffusion legions in a first n-well; and a PMOS floating gate transistor having a drain and a source formed as separate p+ diffusion regions in the n-well, wherein the p+ diffusion legion that forms the floating gate transistor's source is the same p+ diffusion region that forms the select gate transistor's drain; and wherein the source of the floating gate transistor is adapted to serve as the control plate.

In accordance with another aspect of the invention, a method is provided. The method includes the acts of: providing a single-poly 2T PMOS memory cell having a floating gate transistor in a first n-well and a control plate in a second n-well; grounding a drain of the floating gate transistor; raising a source of the floating gate transistor to a voltage range of between 5 and 15 V; and raising the control plate to a voltage range between 5 and 15 V to inject hot electrons into the floating gate.

In accordance with another aspect of the invention, a method is provided. The method includes the acts of: providing a single-poly 2T PMOS memory cell having a floating gate transistor, wherein a source of the floating gate transistor is adapted to serve as a control plate for the 2T PMOS memory cell; grounding a drain of the floating gate transistor; and raising a source of the floating gate transistor to a voltage range of between 5 and 15 V to inject hot electrons into the floating gate.

BRIEF DESCRIPTION OF THE DRAWINGS

Use of the same reference symbols in different figures indicates similar or identical items.

DETAILED DESCRIPTION

Figure 1:
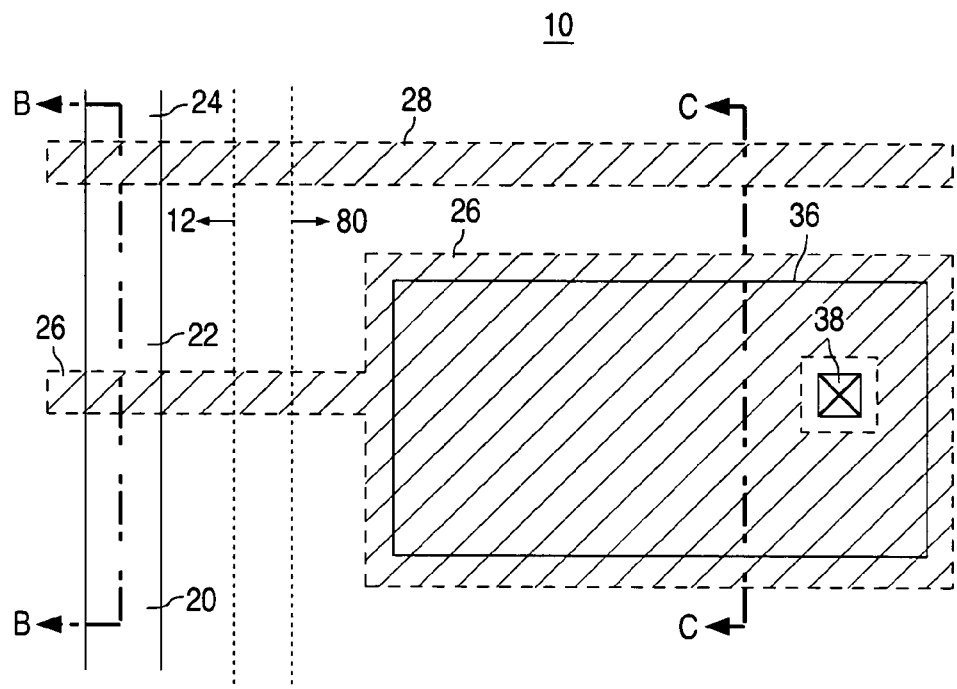
FIG. 1 is top view of a multiple-time programming (MTP) 2T PMOS single-poly flash cell according to one embodiment of the invention.
Figure 2:
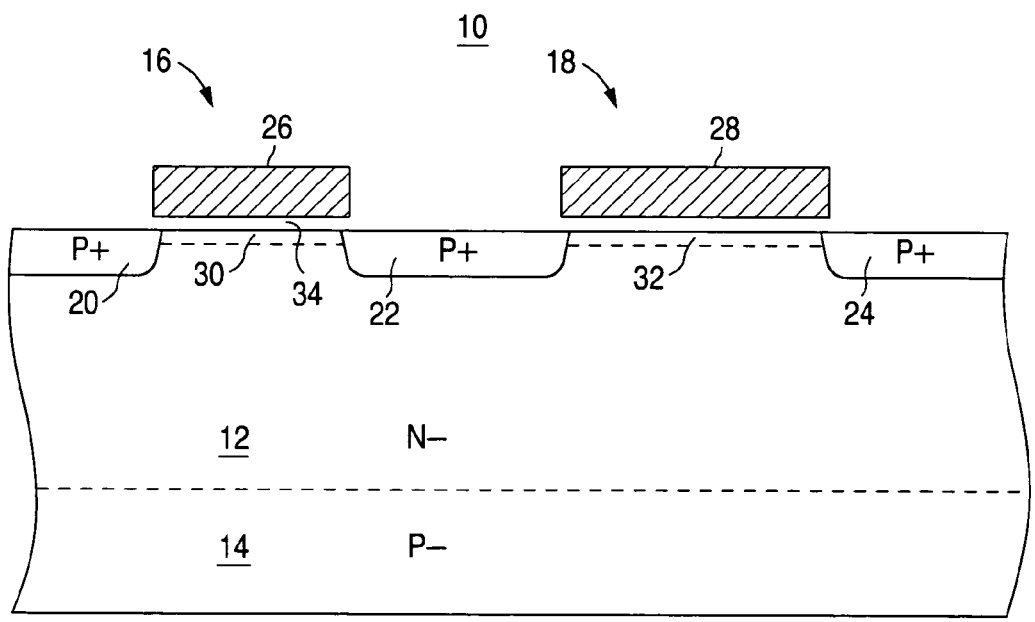
FIG. 2 is a cross-sectional view of the MTP cell of FIG. 1 taken along line B—B.
Figure 3:
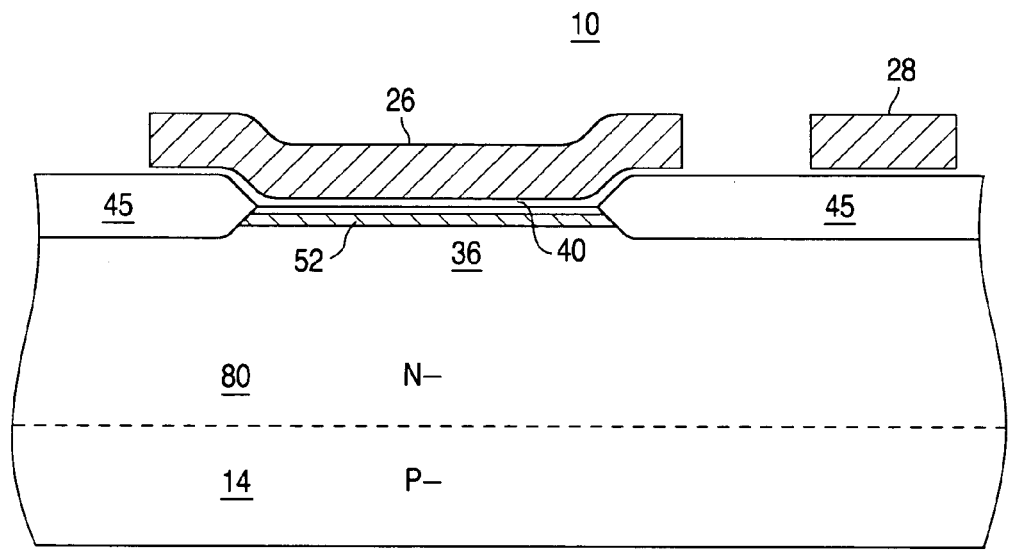
FIG. 3 is a cross-sectional view of the MTP cell of FIG. 1 taken along line C—C.

Referring now to the FIGS. 1 through 3, a 2T PMOS memory cell 10 is shown. As seen in cross-section in FIG. 2, memory cell 10 is formed within a n-well 12 provided within a p-type substrate 14 and includes a floating gate (FQ) PMOS transistor 16 and a PMOS select gate (SG) transistor 18. A first p+ diffusion region 20 may serve as a source 20 of FG transistor 16. A shared p+ diffusion region 22 serves as both a drain for FG transistor 16 and as a source for SG transistor 18. As such, p+ diffusion region 22 may be denoted as a drain/source region 22. A third p+ diffusion region 24 serves as the drain for SG transistor 18. Given the symmetry of memory cell 10, it will be appreciated that the source and drain designations may be reversed depending upon current direction through FG transistor 16 and SG transistor 18. In other words, p+ diffusion region 20 may serve as a drain for PG transistor 16, shared p+ diffusion region 22 as a source for FG transistor 16 and as a drain for SG transistor 18, and p+ diffusion region 24 as a source for SG transistor 18.

A tunnel oxide layer 34, which may have a thickness between approximately 80 and 130 Å, separates a floating gate 26 for FG transistor 16 from n-well region 12. When floating gate 26 is negatively charged with respect to n-well 12, a hole-containing channel 30 is induced in n-well 12. A similar channel 32 may be induced for SG transistor 18. As is known in the art, FG transistor 16 includes a control plate 36 coupled to floating gate 26 such that floating gate 26 and control plate 36 form a MOS capacitor. By applying a bias voltage to control plate 36, the bias voltage enhances the attraction of hot electrons into floating gate 26 such that FG transistor 16 may be programmed as will be explained further herein. In contrast to the prior art approaches discussed previously, control plate 36 is formed in a separate n-well 80 as seen in FIGS. 1 and 3. Advantageously, the use of separate n-well 80 keeps control plate 36 electrically isolated from n-well 12. Should just a single n-well region be used, an p-type control plate may be formed in the single n-well region. However, the amount of voltage that may be applied to such a control plate is then limited by the amount of voltage applied to the n-well to maintain a reverse bias on the p-n junction between the control plate and the n-well. To remove this limitation in a single n-well embodiment, a control plate may be formed as an n-type diffusion region isolated from the remainder of the n-well region by a p-type diffusion region. In such an implementation, the resulting single-n-well control plate formed as an n-type diffusion region may be biased without causing an undesirable current flow to the n-well region 12. But forming the isolating p-type diffusion region requires an extra mask and implantation step. Advantageously, embodiments of the present invention requires no additional mask step other than those already used in a standard CMOS process.

Referring back to FIG. 1, control plate 36 is formed by that portion of n-well 80 covered by an extension of floating gate 26. A contact 38 (FIG. 1) is opened in floating gate 26 and in a layer of oxide 40 interposed between the extension of floating gate 26 and control plate 36 to enable electrical contact with control plate 36. Oxide 40 may have a thickness of approximately 80 to 350 Å. It will be appreciated that isolation barriers 45 shown in FIG. 3 may be shallow trench isolation structures (STI), or other suitable structures such as local field oxide (LOCOS) as is known in the art Referring again to FIG. 3, it may be seen that control plate 36 is formed by that portion of n-well 80 that is covered by the extension of floating gate 26 as limited by isolation barriers 45.

To program memory cell 10, hot electrons are introduced into floating gate 26 by either band-to-band tunneling (BTBT) or avalanche breakdown tunneling. Alternatively, a combination of BTBT and Fowler-Nordheim tunneling may be used to program cell 10. The programming of memory cell 10 depends upon its configuration—as discussed previously, with respect to FIG. 2, the cross-sectional symmetry allows the current flow to be reversed such that what was a drain becomes a source and vice-versa. Thus, in one embodiment, p+ diffusion regions 20 and 22 are sources for FG transistor 16 and SG transistor 18, respectively, whereas p+ diffusion regions 22 and 24 are drains for FG transistor 16 and SG transistor 18, respectively. Both p+ diffusion region 20 (acting as source) and n-well 12 may be charged to 8 V while p+ diffusion region 24 (acting as drain) and select gate 28 are grounded. Because SG transistor 18 will then be conductive, shared diffusion region 22 will be pulled low and be reverse biased with respect to n-well 12. Positively-charged holes will thus drift from positively-charged source 20 to drain 22 through channel 30. These holes may collide with electrons in the depletion region that exists at the p-n junction between shared p+ diffusion region 22 and n-well 12 and produce hot electrons. To induce BTBT tunneling of hot electrons from channel 30 to floating gate 26, floating gate 26 should be positively charged by capacitive coupling from control plate 36. For example, an 8.5 V potential may be applied to control plate 36 in a pulsing fashion to attract the hot electrons into floating gate 26.

Referring again to FIG. 3, the surface area of control plate 36 is limited by that portion of floating gate 26 that is not isolated from control plate 36 by isolation barriers 45. In turn, this surface area limits the capacitive coupling of the control plate 36 and floating gate 26. In general, an efficient programming of floating gate 26 requires that the capacitive coupling between these two elements be such that floating gate 26 reaches 90% of the potential pulsed onto control plate 36. But note that in applications wherein storage density is not an issue, the surface area of control plate 36 may simply be increased until the desired degree of capacitive coupling is achieved.

It will be appreciated that maintaining a "flatband" or an "accumulation" condition between control plate 36 and the extension of floating gate 26 that covers control plate 36 will result in the best capacitive coupling because no inversion layer will then exist at the surface of control plate 36. A flat band condition occurs when the Fermi levels of control plate 36 and the extension of floating gate 26 are equal. If an inversion layer starts to form at the surface of control plate 36, it will inhibit the full coupling of the potential on control plate 36 to the extension of floating gate 26 that covers control plate 36. Such a depletion region would have an associated potential that would inhibit the full coupling of the potential on control plate 36 to the extension of floating gate 26 that covers control plate 36. Should the CMOS process being used to form memory cell 10 (FIG. 1) include a threshold adjust implantation step as is conventional in the CMOS art, N-well 80 would receive a surface implantation resulting in an N$^+$ layer 52 adjacent to the surface of control plate 36. In this fashion, an accumulation condition occurs with the help of surface fixed charges. The relative surface area required for control plate 36 to provide the necessary capacitive coupling will then be at a minimum. But it will be appreciated that if control plate 36 does not receive a threshold adjust implantation such that layer 52 is missing, the surface area of control plate 36 may simply be increased until the desired capacitive coupling is achieved.

As discussed above, because of the symmetry in the cross-section of memory cell 10 as seen in FIG. 2, the direction of current flow through channel 30 during programming of floating gate 26 is arbitrary in that shared p+ diffusion region 22 may act as either a source or a drain to floating gate transistor 16 as hot electrons tunnel into floating gate 26. Accordingly, to program floating gate transistor 16 in a converse fashion to that discussed previously, p+ diffusion region 24 and n-well 12 may be positively charged while select gate 28 is grounded so that shared p+ diffusion region 22 is also pulled to this positive potential minus the threshold voltage for select gate transistor 18. So that shared p+ diffusion region 22 acts as a source and p+ diffusion region 20 acts as a drain for FG transistor 16, p+ diffusion region 20 is grounded, thereby attracting holes from source 22. Because p+ diffusion region 20 will then be reverse biased with respect to n-well 80, a depletion region exists at the p-n junction between n-well 12 and p+ diffusion region 20 such that holes attracted from shared p+ diffusion region 22 may collide with electrons in the depletion region and generate hot electrons. To draw these hot electrons into floating gate 26 and to enhance the depletion region, control plate 36 is positively charged so that floating gate 26 may be brought to the appropriate programming voltage through capacitive coupling.

Having programmed memory cell 10 by injecting hot electrons into floating gate 26, FG transistor 16 becomes a depletion mode device. Unlike an enhancement-type transistor, a depletion-type transistor is nominally in the conductive state and the threshold voltage for the gate/source potential determines when the device is non-conductive. To make channel 30 for FG transistor 16 non-conductive, the voltage potential on control plate 36 must be made positive with respect to the source of FG transistor 16 to deplete the holes within channel 30. Thus, a programmed FG transistor 16 will be conductive when its control plate voltage is below a positive threshold voltage whereas a non-programmed FG transistor 16 will not be conductive under these conditions. In this fashion, by determining whether a 2T PMOS memory cell 10 is conductive at a voltage below the positive threshold voltage, the state of the binary bit stored by memory cell 10 is also determined.

Referring again to the programming of memory cell 10, regardless of the direction of the current flow through channels 30 and 32 as memory cell 10 is programmed, it may be seen from the preceding discussion that a drain for FG transistor 16 will be grounded while another terminal of memory cell 10 (either p+ diffusion region 20 or p+ diffusion region 24) will be positively charged. As discussed, for example, in commonly-assigned U.S. Pat. No. 5,912,842, 2T PMOS memory cells may be arranged in arrays wherein the analogous terminal to that just discussed for memory cell 10 couples to a bit line of the array. Using this terminology, the programming, reading, and erasing voltages for 2T PMOS cell 10 are the same as disclosed for the single-poly 2T PMOS cell within a single n-well in previously-discussed U.S. Pat. No. 5,736,764, the contents of which are hereby incorporated by reference in their entirety. In particular, suitable programming voltages for memory cell 10 are: bit line 0 V, select gate 0 V, source 5 to 15V, n-well 80: 5 to 15V, control plate 36:5 to 15V. As compared to the relatively high voltage being applied during programming, the coupling of the slightly negative or zero voltage bias applied to control plate 36 for erasing is particularly limited by the degree of capacitive coupling between control plate 36 and floating gate 26. The threshold adjust implant discussed previously will assist in increasing the capacitive coupling of this slightly negative or zero voltage bias to floating gate 26 during an erase cycle.

Figure 4A:
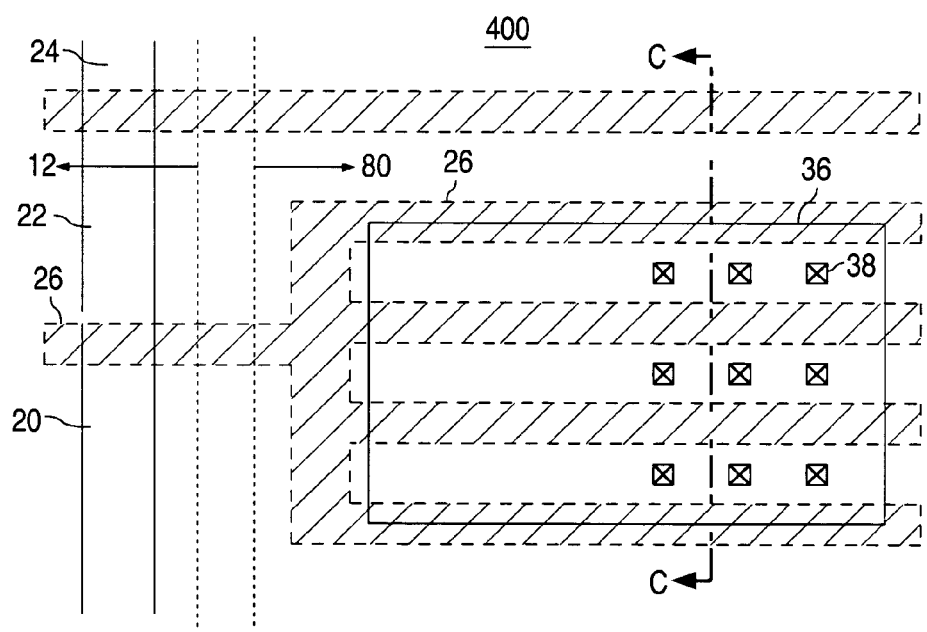
FIG. 4a is a top view of a single-poly MTP 2T PMOS memory cell according to one embodiment of the invention.
Figure 4B:
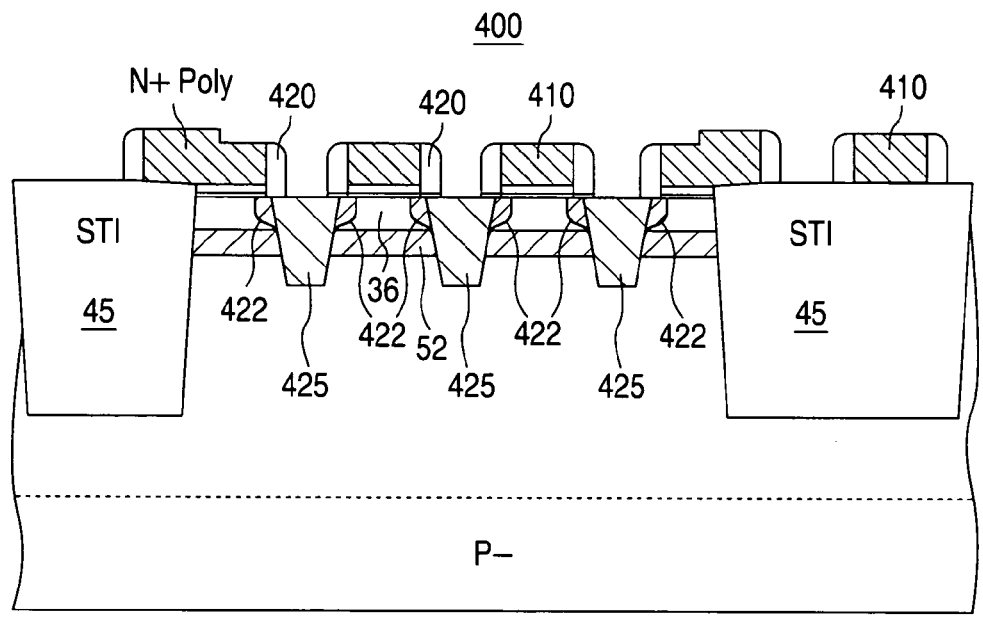
FIG. 4b is a cross-sectional view of the MTP memory cell of FIG. 4a taken along line C—C.

As discussed previously, the overlap area between control plate 36 and the extension of floating gate 26 limits the capacitive coupling between control plate 36 and floating gate 26. In general, this effect makes the maximization of the overlap area for the extension of floating gate 26 desirable. However, because achieving an accumulation condition between control plate 36 and the extension of floating gate 26 that covers control plate 36 is also desirable, there are embodiments of memory cell 10 wherein a smaller overlap area between control plate 36 and the extension of floating gate 26 is accepted to achieve a better accumulation condition. For example, in a single-poly 2T PMOS memory cell 400 shown in FIGS. 4a and 4b, the extension of floating gate 26 that covers control plate 36 is digitated with finger extensions 410. Referring to the top view of FIG. 4a, the cross-section along lines B:B would be as described with respect to FIG. 2 for memory cell 10. Thus, memory cells 10 and 400 differ only with respect to control plate 36 and the extension of floating gate 26 that covers control gate 36. Should the CMOS process being used to form memory cell 400 use both a high voltage and a low voltage LDD implant scheme, these two types of LDD implants may be used as well be explained with respect to the cross section of FIG. 4b. Both LDD implants 422 may first be implanted after formation of polysilicon floating gate 26 and its finger extensions 410. After formation of spacers 420 as known in the art, a conventional n+ S/D implant may be made to form n+ diffusion regions 425. However, the width of finger extensions 410 follows the design rules for a low voltage devices (corresponding to the low voltage LDD implant scheme) such that it becomes harder for the surface of control plate 36 to be inverted. In this fashion, the capacitive coupling between control plate 36 and floating gate 26 is also enhanced. As discussed with respect to FIG. 3, the lateral extent of control plate 36 in FIG. 4b may be limited by isolation barriers 45 such as shallow trench isolation barriers. The programming, reading, and erasure voltage remain the same as described previously with respect to memory cell 10. It will be appreciated that LDD regions may also be formed for the p+ diffusion regions 20, 22, and 24 discussed with respect to memory cell 10.

Figure 5:
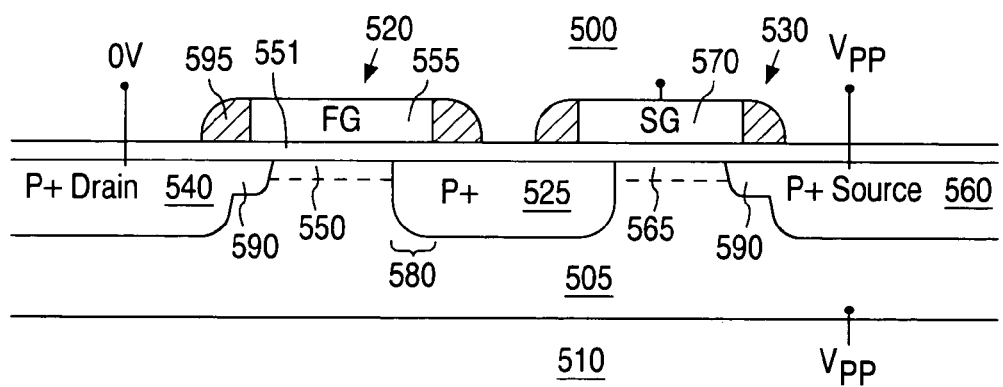
FIG. 5 is a cross-sectional view of a single-poly one-time programming (OTP) 2T PMOS memory cell according to one embodiment of the invention.

The density of the previously-described embodiments is limited by the desire for a relatively large surface area for control plate 36. Even greater density may be achieved in a single-poly/single n-well architecture if the option of electrically erasing the memory cell can be omitted since the relatively large surface area of control plate 36 is primarily driven by the coupling requirements for the erase operation. As shown in cross section in FIG. 5a, a 2T memory cell 500 achieves a high density design at the cost of not having an erase option. Because it does not have an erase option, memory cell 500 is a one-time programming (OnP) memory cell. 2T memory cell 500 is contained within a single n-well 505 in p− substrate 510. In this embodiment, a shared p+ diffusion region 525 acts as source to FG transistor 520 and as a drain to SG transistor 530. FG transistor 520 also includes a p+ diffusion region 540 as its drain that couples to source 525 through a channel 550 that may be induced by a floating gate 555 separated from channel 550 by tunnel oxide layer 551. Similarly, SG transistor 530 includes a p+ diffusion region 560 that couples to drain 525 through a channel 565 that may be induced by a select gate 570. No separate diffusion region in n-well 505 need be used to form a control plate. Instead, the control plate is simply formed by an exaggerated overlap 580 of shared p+ diffusion region 525 with respect to floating gate 555. Programming of memory cell 500 is largely analogous to that already described with respect to memory cell 10 wherein shared p+ diffusion region 22 of memory cell 10 acts as source for PG transistor 16. Accordingly, source/p+ diffusion region 560 and n-well 505 are brought high in potential to, for example, VPP and SG transistor 530 made conductive by grounding (or bringing negative) select gate 570. Shared p+ diffusion region 525 will thus equal the potential of source 560 minus the threshold voltage for SG transistor 530. Drain/p+ diffusion region 540 for floating gate transistor 520 is grounded so that holes may be accelerated from positively-charged shared p+ diffusion region 525 through channel 550 to collide with electrons in the resulting depletion region at the reverse-biased pn junction between p+ drain 540 and n-well 505. Note that no separate control plate terminal is available to be pulsed with a positive programming voltage so that floating gate 555 is brought sufficiently positive to attract these hot electrons. Instead, shared p+ diffusion region 525 may have a sufficient capacitive coupling with floating gate 555 through overlap 580 so that floating gate 555 can be programmed. To achieve this overlap, shared p+ diffusion region 525 is not formed in the same fashion as are p+ diffusion regions 540 and 560. Instead, as is known in the art for high-density designs, p+ diffusion regions 540 and 560 may include "lightly-doped drain" (LDD) regions 590. LDD regions 590 are formed before formation of spacers 595 and the subsequent p+ implantations that complete p+ diffusion regions 540 and 560 as is known in the art. In contrast, shared p+ diffusion region 525 requires, for example, an extra mask step so that an angled implantation step may be performed to form p+ overlap 580 between p+ diffusion region 525 and floating gate 555 together with some thermal cycles to drive the p+ junction deeper into n-well 505. In general, the lateral extent of overlap 580 may be at least 0.05 micron or more. A greater lateral extent of overlap 580 may be desirable so that floating gate may be charged through capacitive coupling to be over 45% of the potential of shared pt diffusion region 525 such that hot electrons may tunnel through tunnel oxide layer 551 and program memory cell 500 by charging floating gate 555. In addition, the LDD region 590 for drain 540 may be minimized to provide greater programming efficiency.

Because source/shared p+ diffusion region 525 and the control plate formed by overlap 580 will always be at the same potential; there is no electrical provision for erasing memory cell 500. Instead, erasure using exposure to ultra-violet light may be performed. If, however, memory cell 500 is packaged without providing a window for the ultra-violet light, such an erasure could only be performed while memory cell 500 remained a wafer. Although only an OTP operation is thus enabled, the area occupied by a separate diffusion region used to form a control plate in many-time-programming (MTP) applications can be significant. For example, this area is at least one-third to one-fifth of the MTP cell size in single-n-well embodiments. In the separate n-well embodiments discussed above, the area occupied by the control plate is of course several times more significant. Accordingly, the OTP memory cell 500 provides significant density benefits with respect to conventional MTP designs.

Just as with respect to memory cell 10, the current direction used while programming the OTP memory cell disclosed herein may be reversed so that shared p+ diffusion region 525 may be reconfigured to act as a drain rather than a source to FG transistor 520. However, unlike some embodiments of memory cell 10, the OTP memory cell disclosed herein does not have a symmetric cross-section. Thus, the two alternative embodiments are structurally different.

Figure 6:
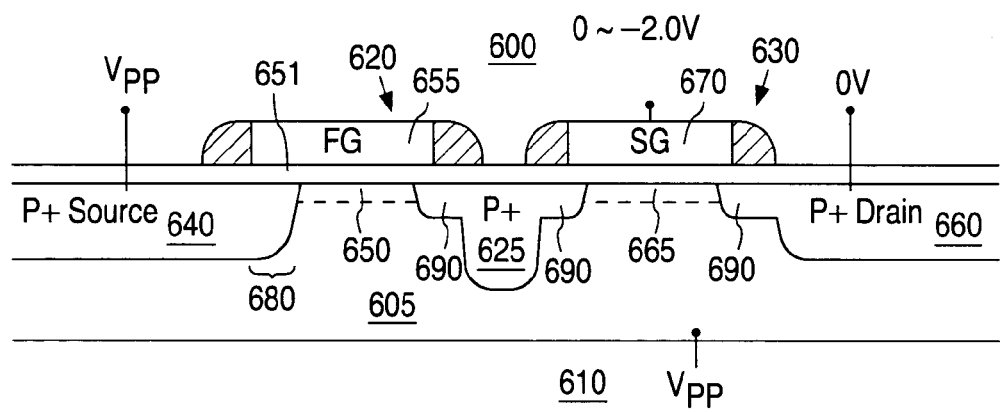
FIG. 6 is a cross-sectional view of a single-poly one-time programming (OTP) 2T PMOS memory cell according to another embodiment of the invention.

The alternative embodiment of an OTP 2T PMOS memory cell 600 is shown in FIG. 6. 2T memory cell 600 is contained within a single n-well 605 in p− substrate 610. In this embodiment, a shared p+ diffusion region 625 acts as drain to an FG transistor 620 and as a drain to an SG transistor 630. FO transistor 620 also includes a p+ diffusion region 640 as its source that couples to drain 625 through a channel 650 that may be induced by a floating gate 655 separated from channel 650 by tunnel oxide layer 651; Similarly, SC transistor 630 includes a drain/p+ diffusion region 660 that couples to source 625 through a channel 665 that may be induced by a select gate 670. The control plate is formed by an exaggerated overlap 680 between p+ diffusion region 640 and floating gate 655. Accordingly, regardless of the current direction during programming, the control plate is always formed by an overlap of the source and the floating gate.

Programming of OWP memory cell 600 is analogous to that described with respect to OTP memory cell 500. Accordingly, drain/p+ diffusion region 660 is grounded while n-well 605 is brought high in potential to, for example, VPP and SG transistor 630 made conductive by grounding (or bringing negative) select gate 670. Shared p+ diffusion region 625 will thus equal the potential of drain 660 plus the threshold voltage for SG transistor 630. A depletion region will exist at the reverse-biased p-n junction between shared p+ diffusion region 625 and n-well 605. Conditions are thus ripe for programming if holes can be driven across channel 650 to collide with the electrons in the depletion region. Accordingly, source/p+ diffusion region 640 for floating gate transistor 620 is brought high in potential to, for example, VPF so that holes may be accelerated towards drain 625. As discussed with respect to OTP memory cell 500, no separate control plate terminal is available to be pulsed with a positive programming voltage so that floating gate 655 may be brought sufficiently positive to attract any hot electrons. Instead, source 640 may have a sufficient capacitive coupling with floating gate 655 through overlap 680 so that floating gate 655 can be programmed. To achieve this overlap, source/p+ diffusion region 640 is not formed the same as p+ diffusion regions 625 and 660. Instead, as is known in the art for high-density designs, p+ diffusion regions 625 and 660 include "lightly-doped drain" (LDD) regions 690 formed before the formation of spacers 695 as discussed analogously with respect to memory cell 500. In contrast, p+ diffusion region 640 requires, for example, an extra mask step so that an angled implantation step may be performed to form p+ overlap 680 between p+ diffusion region 640 and floating gate 655. As discussed with respect to OTP memory cell 500, this overlap may have a lateral extent of at least 0.05 micron that may be altered so as to achieve a sufficient capacitive coupling between source 640 and floating gate 655 such that the potential of floating gate 655 is over 45% of the potential induced on source 640. Because source 640 and the control plate it forms will, of course, always be at the same potential, OTP memory cell

600 can only be erased through exposure to ultraviolet light as discussed with respect to OTP memory cell 506.

Figure 7:
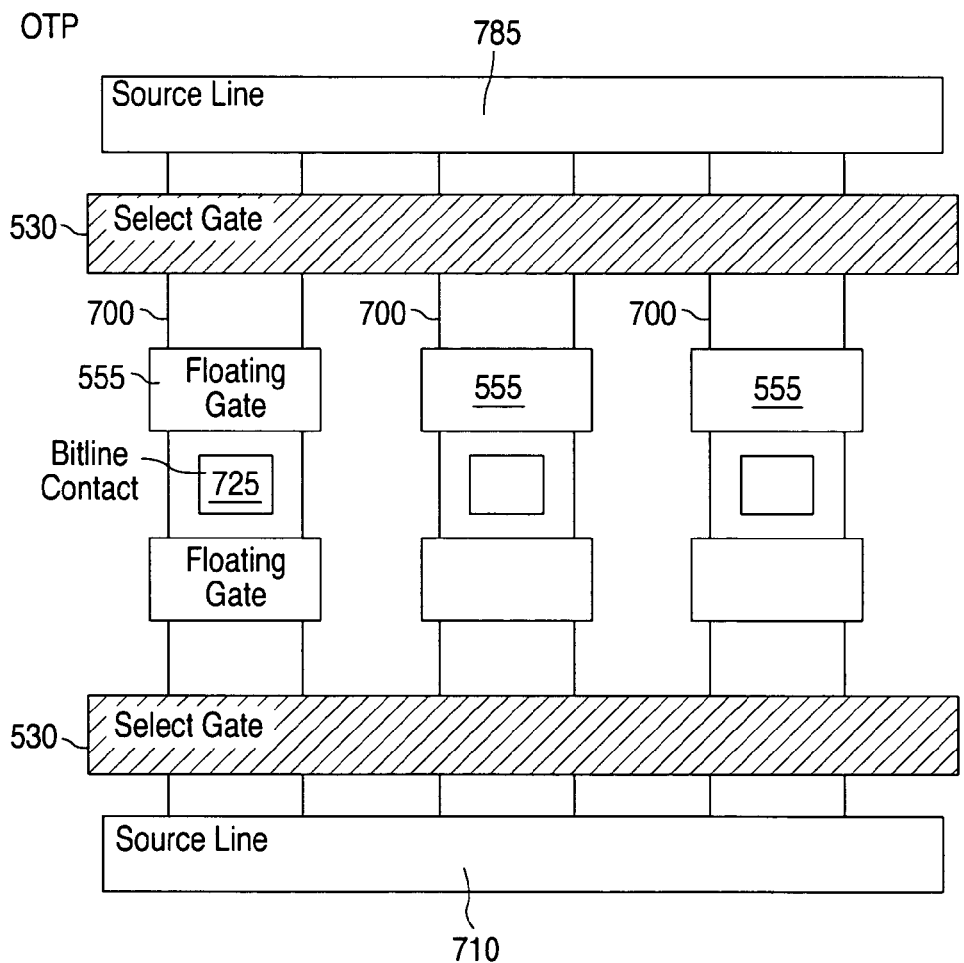
FIG. 7 is a top view of an array of the OTP memory cells of FIG. 5.

An example layout for an array of OTP memory cells 500 is shown in FIG. 7. Two OTP memory cells 500 are coupled in series to form dual memory cells 700. A common source line 705 and 710 couples to the respective sources for the select gate transistors in each dual memory cell 700. A bit line contact 720 for each dual memory cell 700 couples to the drains for the floating gate transistors. It will be appreciated that the layout for an array of OTP memory cells 500 may be varied with respect to that shown in FIG. 7. Moreover, an analogous or different layout may be used to form an array of OTP memory cells 600.

Although the invention has been described with respect to particular embodiments, this description is only an example of the invention's application and should not be taken as a limitation. Consequently, the scope of the invention is set forth in the following claims.

We claim:

1. A single-poly two-transistor (2T) PMOS memory cell, comprising:
    a PMOS soled gate transistor having a drain and a source formed as separate p+ diffusion regions in a first n-well;
    a PMOS floating gate transistor having a drain and a source formed as separate P+ diffusion regions in the n-well, wherein the p+ diffusion region that forms the floating gate transistor's drain is the same p+ diffusion region that forms the select gate transistor's source; and
    a control plate for the PMOS floating gate transistor formed within a second n-well well, the second n-well being separated from the first n-well.

2. The 2T PMOS memory cell of claim 1, wherein an extension of a floating gate for the PMOS floating gate transistor overlays the separate n-well, the control plate being formed by that portion of the second n-well covered by the extension of the floating gate.

3. The 2T PMOS memory cell of claim 2, wherein the extension of the floating gate is doped n+ and the second n-well has an n-type type threshold adjust implant.

4. The 2T PMOS memory cell of claim 3, wherein the n-type doping of the extension of the floating gate and threshold adjust implant is such that their Fermi levels are substantially equal.

5. The 2T PMOS memory cell of claim 2, wherein the extension of a floating gate for overlaying the second n-well includes a digitated portion comprising finger extensions.

6. The 2T PMOS memory cell of claim 5, wherein the second n-well includes LDD implants between adjacent fingers of the digitated portion.

7. The 2T PMOS memory cell of claim 6, wherein the finger extensions are bounded by LDD spacers, the second n-well including an n+ diffusion region between adjacent finger extension's LDD spacers.

* * * * *